US009373695B2

(12) United States Patent
Chen et al.

(10) Patent No.: US 9,373,695 B2
(45) Date of Patent: *Jun. 21, 2016

(54) METHOD FOR IMPROVING SELECTIVITY OF EPI PROCESS

(71) Applicant: TAIWAN SEMICONDUCTOR MANUFACTURING COMPANY, LTD., Hsinchu (TW)

(72) Inventors: Kuan-Yu Chen, Taipei (TW); Hsien-Hsin Lin, Hisn-Chu (TW); Chun-Feng Nieh, Hsinchu (TW); Hsueh-Chang Sung, Zhubei (TW); Chien-Chang Su, Kaohsiung (TW); Tsz-Mei Kwok, Hsinchu (TW)

(73) Assignee: Taiwan Semiconductor Manufacturing Compay, Ltd., Hsin-Chu (TW)

( * ) Notice: Subject to any disclaimer, the term of this patent is extended or adjusted under 35 U.S.C. 154(b) by 211 days.

This patent is subject to a terminal disclaimer.

(21) Appl. No.: 13/942,400

(22) Filed: Jul. 15, 2013

(65) Prior Publication Data

US 2013/0299876 A1    Nov. 14, 2013

Related U.S. Application Data

(63) Continuation of application No. 12/545,705, filed on Aug. 21, 2009, now Pat. No. 8,487,354.

(51) Int. Cl.
*H01L 29/66* (2006.01)
*H01L 21/311* (2006.01)
*H01L 21/3115* (2006.01)
*H01L 21/8238* (2006.01)
*H01L 29/78* (2006.01)
*H01L 27/092* (2006.01)

(52) U.S. Cl.
CPC .... *H01L 29/66477* (2013.01); *H01L 21/31116* (2013.01); *H01L 21/31155* (2013.01); *H01L 21/823807* (2013.01); *H01L 21/823814* (2013.01); *H01L 27/092* (2013.01); *H01L 29/66636* (2013.01); *H01L 29/7848* (2013.01); *H01L 29/6656* (2013.01); *H01L 29/6659* (2013.01)

(58) Field of Classification Search
CPC .................................................... H01L 29/6656
USPC ......................................................... 257/288
See application file for complete search history.

(56) References Cited

U.S. PATENT DOCUMENTS

| 5,254,866 | A  | * | 10/1993 | Ogoh ........................... 257/369 |
| 5,856,696 | A  | * | 1/1999  | Blanchard ..................... 257/377 |
| 6,165,826 | A  | * | 12/2000 | Chau et al. .................... 438/231 |
| 6,479,350 | B1 | * | 11/2002 | Ling et al. ..................... 438/265 |
| 6,902,971 | B2 | * | 6/2005  | Grudowski .................... 438/218 |
| 6,939,814 | B2 | * | 9/2005  | Chan et al. .................... 438/778 |

(Continued)

*Primary Examiner* — Mohammad Islam
*Assistant Examiner* — Ankush Singal
(74) *Attorney, Agent, or Firm* — Haynes and Boone, LLP

(57) ABSTRACT

The present disclosure provides a method of fabricating a semiconductor device that includes providing a semiconductor substrate, forming a gate structure over the substrate, forming a material layer over the substrate and the gate structure, implanting Ge, C, P, F, or B in the material layer, removing portions of the material layer overlying the substrate at either side of the gate structure, forming recesses in the substrate at either side of the gate structure, and depositing a semiconductor material in the recesses by an expitaxy process.

20 Claims, 6 Drawing Sheets

(56) References Cited

U.S. PATENT DOCUMENTS

| | | | |
|---|---|---|---|
| 7,112,495 B2* | 9/2006 | Ko et al. | 438/300 |
| 7,407,860 B2* | 8/2008 | Kim et al. | 438/300 |
| 7,763,510 B1* | 7/2010 | Zhang et al. | 438/199 |
| 7,767,539 B2* | 8/2010 | Gauthier et al. | 438/423 |
| 7,816,909 B2* | 10/2010 | Chan et al. | 438/18 |
| 7,875,520 B2* | 1/2011 | Wu et al. | 438/300 |
| 7,883,979 B2* | 2/2011 | Chen et al. | 438/300 |
| 8,198,194 B2* | 6/2012 | Yang et al. | 438/700 |
| 2005/0245021 A1* | 11/2005 | Hornung et al. | 438/231 |
| 2007/0001233 A1* | 1/2007 | Schwan et al. | 257/369 |
| 2007/0034945 A1* | 2/2007 | Bohr et al. | 257/338 |
| 2007/0045729 A1* | 3/2007 | Hoentschel et al. | 257/344 |
| 2007/0048961 A1* | 3/2007 | Chang et al. | 438/386 |
| 2007/0096148 A1* | 5/2007 | Hoentschel et al. | 257/192 |
| 2007/0096195 A1* | 5/2007 | Hoentschel et al. | 257/315 |
| 2007/0284668 A1* | 12/2007 | Shen et al. | 257/364 |
| 2007/0287244 A1* | 12/2007 | Shen et al. | 438/199 |
| 2008/0012018 A1* | 1/2008 | Waite et al. | 257/69 |
| 2008/0102573 A1* | 5/2008 | Liang et al. | 438/231 |
| 2008/0128834 A1* | 6/2008 | Yang et al. | 257/411 |
| 2008/0191243 A1* | 8/2008 | Liu et al. | 257/190 |
| 2009/0095982 A1* | 4/2009 | Kim | 257/190 |
| 2009/0280627 A1* | 11/2009 | Pal et al. | 438/504 |
| 2010/0171180 A1* | 7/2010 | Zhang et al. | 257/369 |
| 2010/0207214 A1* | 8/2010 | Chuang et al. | 257/369 |
| 2011/0012197 A1* | 1/2011 | Hung et al. | 257/344 |
| 2012/0267683 A1* | 10/2012 | Kronholz et al. | 257/192 |
| 2014/0048886 A1* | 2/2014 | Chuang et al. | 257/369 |

\* cited by examiner

METHOD FOR IMPROVING SELECTIVITY OF EPI PROCESS

PRIORITY DATA

The present application is a continuation application of U.S. patent application Ser. No. 12/545,705, filed Aug. 21, 2009, which is incorporated herein by reference in its entirety.

BACKGROUND

When a semiconductor device such as a metal-oxide-semiconductor field-effect transistors (MOSFETs) is scaled down through various technology nodes, high-k dielectric material and metal are adopted to form a gate stack. In addition, a strained substrate using epitaxy (epi) silicon germanium (SiGe) may be used to enhance carrier mobility and improve device performance. However, current techniques to form these strained structures have not been satisfactory in all respects. For example, an etchant gas may be used with the epi process to maintain selectivity between the spacer and the substrate which can adversely impact the SiGe growth rate.

SUMMARY

One of the broader forms of an embodiment of the present invention involves a method of fabricating a semiconductor device. The method includes providing a semiconductor substrate; forming a gate structure over the substrate; forming a material layer over the substrate and the gate structure; implanting one of Ge, C, P, F, and B in the material layer; removing portions of the material layer overlying the substrate at either side of the gate structure; forming recesses in the substrate at either side of the gate structure; and depositing a semiconductor material in the recesses by an expitaxy process.

Another one of the broader forms of an embodiment of the present invention involves a method of fabricating a semiconductor device. The method includes providing a semiconductor substrate having a first region and a second region; forming first and second gate structures over the first and second regions of the substrate, respectively; forming a silicon nitride layer over the substrate and the first and second gate structures; performing an implantation process to the silicon nitride layer; protecting the silicon nitride layer overlying the first region of the substrate; removing portions of the silicon nitride layer overlying the second region of the substrate at either side of the second gate structure; forming recesses in the substrate at either side of the second gate structure; and forming a semiconductor material in the recesses, the semiconductor material being different from the semiconductor substrate.

Yet another one of the broader forms of an embodiment of the present invention involves a semiconductor device. The semiconductor device includes a semiconductor substrate; and a transistor that includes: a gate structure disposed on the substrate, the gate structure including sidewall spacers that are implanted with one of Ge, C, P, F, and B; and source and drain regions disposed in the substrate at either side of the gate structure, the source and drain regions formed of a semiconductor material different from the semiconductor substrate.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1:
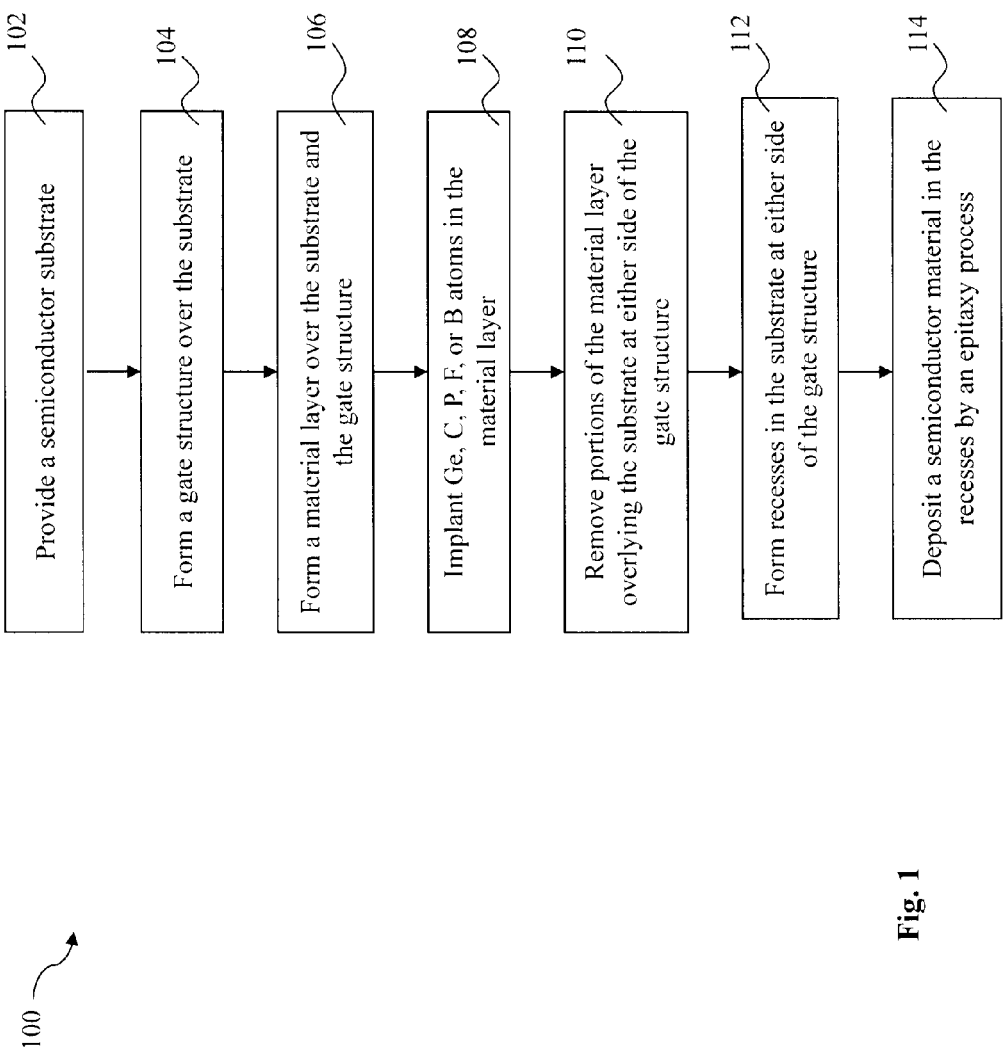
FIG. 1 is a flowchart of a method of fabricating a semiconductor device with strained structures according to various aspects of the present disclosure.

It is to be understood that the following disclosure provides many different embodiments, or examples, for implementing different features of various embodiments. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact.

Referring to FIG. 1, illustrated is a flowchart of a method 100 of fabricating a semiconductor device with strained structures according to various aspects of the present disclosure. The method 100 begins with block 102 in which a semiconductor substrate is provided. The method 100 continues with block 104 in which a gate structure is formed over the substrate. The method 100 continues with block 106 in which a material layer is formed over the substrate and the gate structure. The method continues with block 108 in which Ge, C, P, F or B atoms are implanted in the material layer. The method 100 continues with block 110 in which portions of the material layer overlying the substrate at either side of the gate structure are removed. The method 100 continues with block 112 in which recesses are formed in the substrate at either side of the gate structure. The method 100 continues with block 114 in which a semiconductor material is deposited in the recesses by an epitaxy process. The discussion that follows illustrates various embodiment of a semiconductor device that can be fabricated according to the method 100 of FIG. 1.

Figure 2:
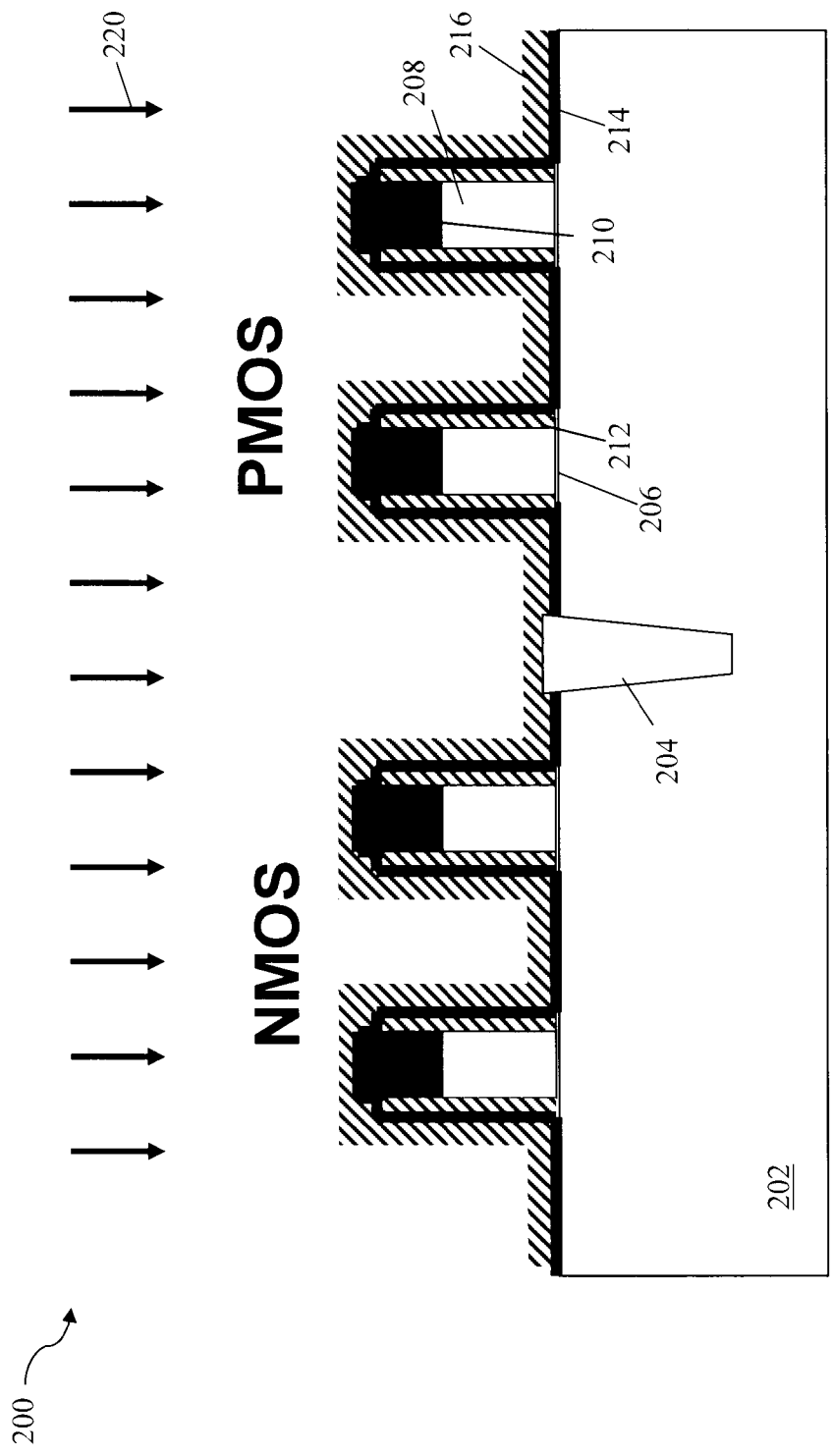
FIGS. 2-6 are cross-sectional views of a semiconductor device at various stages of fabrication according to the method of FIG. 1.

Referring to FIGS. 2-6, illustrated are cross-sectional views of a semiconductor device 200 at various stages of fabrication according to the method 100 of FIG. 1. It is understood that FIGS. 2-6 have been simplified for the sake of clarity to better understand the inventive concepts of the present disclosure. In FIG. 2, the semiconductor device 200 includes a substrate 202. The substrate 202 includes a silicon substrate. In another embodiment, the semiconductor substrate 202 may include an epitaxial layer. For example, the substrate 202 may have an epitaxial layer overlying a bulk semiconductor. The substrate 202 further includes doped regions such as p-wells and n-wells. Furthermore, the substrate 202 may include a semiconductor-on-insulator (SOI) structure such as a buried dielectric layer. Alternatively, the substrate 202 may include a buried dielectric layer such as a buried oxide (BOX) layer, such as that formed by a method referred to as separation by implantation of oxygen (SIMOX)

technology, wafer bonding, selective epitaxial growth (SEG), or other proper method. The semiconductor device 200 includes active regions defined in the substrate 202.

Various shallow trench isolation (STI) structures 204 are formed in the semiconductor substrate for isolating the various active regions. The formation of STI may include etching a trench in a substrate and filling the trench by insulator materials such as silicon oxide, silicon nitride, or silicon oxynitride. The filled trench may have a multi-layer structure such as a thermal oxide liner layer with silicon nitride filling the trench. In one embodiment, the STI structure may be created using a process sequence such as: growing a pad oxide, forming a low pressure chemical vapor deposition (LPCVD) nitride layer, patterning an STI opening using photoresist and masking, etching a trench in the substrate, optionally growing a thermal oxide trench liner to improve the trench interface, filling the trench with CVD oxide, using chemical mechanical planarization (CMP) to etch back, and using nitride stripping to leave the STI structure.

One or more operational devices are formed in the active regions. The operational devices include n-type and p-type metal-oxide-semiconductor field-effect transistors (NMOS and PMOS). The operational devices are configured as an array of NMOS devices and an array of PMOS devices. The NMOS and PMOS devices may be fabricated by CMOS technology processing. Accordingly, it is understood that additional processes may be provided before, during, and after the method 100 of FIG. 1, and that some other processes may only be briefly described herein. Each NMOS and PMOS device includes a gate structure formed on the semiconductor substrate 202. The gate structure includes a gate dielectric 206 and a gate electrode 208. The gate dielectric 206 may include silicon oxide, silicon nitride, high-k dielectric, or other suitable material. The high-k dielectric layer may include a binary or ternary high-k film such as HfOx. Alternatively, the high-k dielectric layer 216 may optionally include other high-k dielectrics such as LaO, AlO, ZrO, TiO, Ta2O5, Y2O3, SrTiO3 (STO), BaTiO3 (BTO), BaZrO, HfZrO, HfLaO, HfSiO, LaSiO, AlSiO, HfTaO, HfTiO, (Ba, Sr)TiO3 (BST), Al2O3, Si3N4, oxynitrides, or other suitable materials. The gate dielectric is formed by a suitable process such as an atomic layer deposition (ALD), chemical vapor deposition (CVD), physical vapor deposition (PVD), thermal oxidation, UV-ozone oxidation, or combinations thereof The gate electrode 208 may include polysilicon (or poly). For example, silane (SiH$_4$) may be used as a chemical gas in a CVD process to form the poly. The poly layer may include a thickness ranging from about 400 to about 800 angstrom (A). The gate structure may further include a hard mask layer 210 formed on the gate electrode 208. The hard mask layer 210 includes silicon oxide. Alternatively, the hard mask layer 210 may optionally silicon nitride, silicon oxynitride, and/or other suitable dielectric materials, and may be formed using a method such as CVD or PVD. The hard mask layer 210 may include a thickness ranging from about 100 to about 400 angstrom (A).

The semiconductor device 200 includes an offset spacer 212 formed on each sidewall of the gate structures. The offset spacer 212 includes silicon nitride and has a thickness ranging from about 4 to about 6 nm. The offset spacer 212 may be formed by CVD, PVD, ALD, plasma enhanced CVD (PECVD), or other suitable technique. An ion implantation process may be performed to form lightly doped source/drain regions (LDD) in the substrate 202. The LDD regions (not shown) are aligned with the offset spacer 212. The ion implantation process may utilize p-type dopants (e.g., B or In) for the PMOS devices and n-type dopants (P or As) for the NMOS devices.

The semiconductor device 200 further includes an oxide layer 214 formed over the substrate 202 and the gate structures. The oxide layer 214 may be formed by CVD, PVD, ALD, or other suitable technique. The oxide layer 214 includes a thickness ranging from about 2 to about 4 nm. The semiconductor device 200 further includes a cap layer 216 formed over the oxide layer 214. The cap layer 216 may be formed of silicon nitride (Si3N4). The cap layer 216 may be formed by CVD, PVD, ALD, or other suitable technique. The cap layer 216 includes a thickness ranging from about 20 to about 30 nm. In the present embodiment, the cap layer 216 has a thickness of about 25 nm. It should be noted that the pad oxide layer 214 may be omitted in some embodiments as will be explained later.

An implantation process 220 is performed on the cap layer 214. The implantation process 220 implants Ge, C, P, F, or B atoms in the cap layer 214. In an embodiment, the implantation process 220 implants Ge utilizing an implant energy of about 5 KeV and a dosage of about 5E14 atoms/cm$^2$. In another embodiment, the implantation process 220 implants C utilizing an implant energy of about 5 KeV and a dosage of about 1E15 atoms/cm$^2$. In other embodiments, the implantation process 220 implants P utilizing an implant energy of about 5 KeV and a dosage of about 1E15 atoms/cm$^2$. In yet another embodiment, the implantation process 220 implants F utilizing an implant energy of about 5 KeV and a dosage of about 1E15 atoms/cm$^2$. In still another embodiment, the implantation process implants B utilizing an implant energy of about 1.5 KeV and a dosage of about 2E13 atoms/cm$^2$. It is noted that an annealing process is not required in conjunction with the implantation process 220. Additionally, it has been observed that responsive to the implantation process 220, the silicon nitride becomes oxygen rich and thus improves selectivity of a subsequent epitaxial process as will be discussed below.

Figure 3:
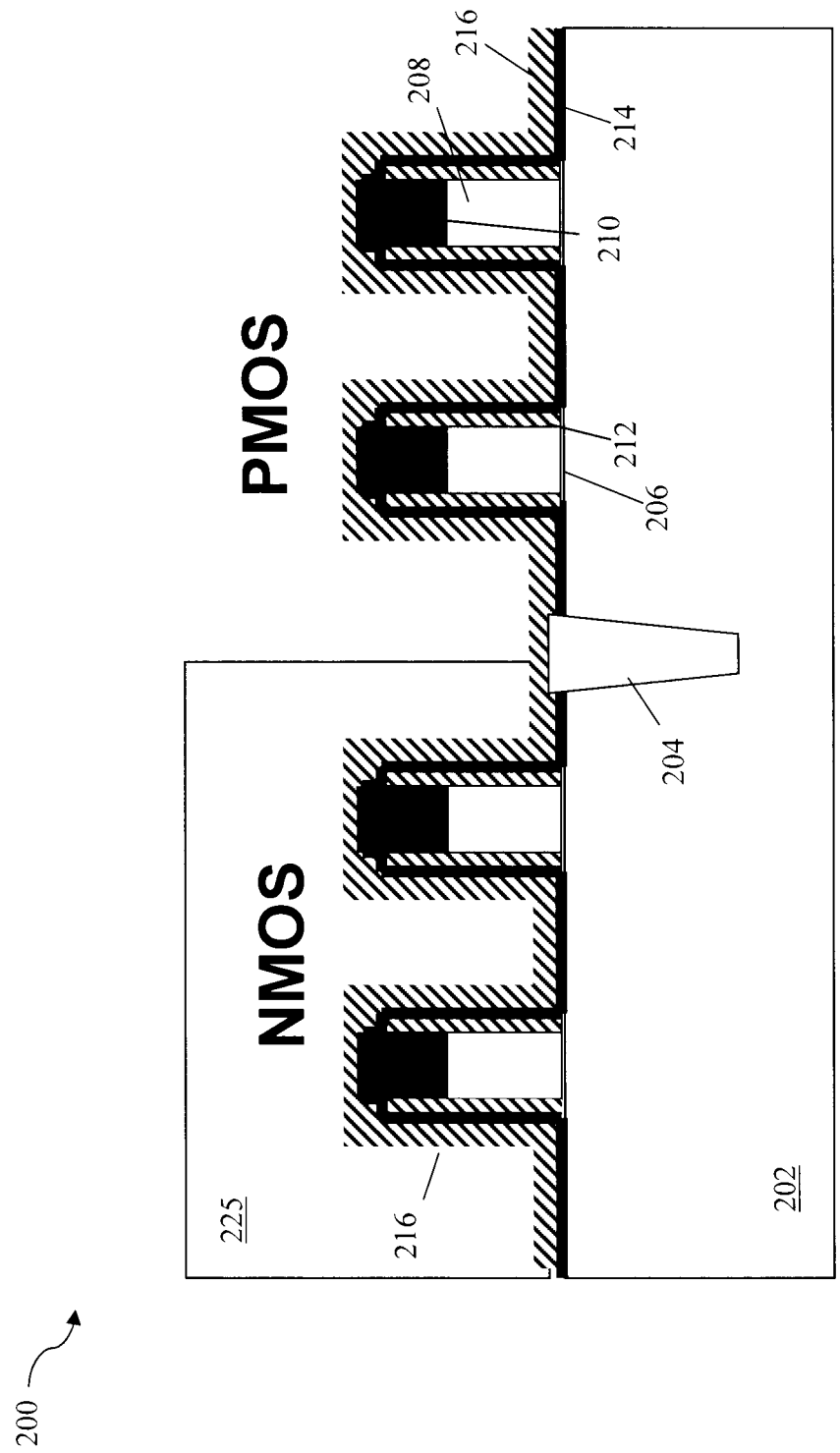

In FIG. 3, a patterned photoresist layer 225 is formed to protect the NMOS devices. The patterned photoresist layer 225 may be formed by a photolithography process. An exemplary photolithography process may include processing steps of photoresist coating, soft baking, mask aligning, exposing, post-exposure baking, developing photoresist and hard baking. The photolithography exposing process may also be implemented or replaced by other proper techniques such as maskless photolithography, electron-beam writing, ion-beam writing, and molecular imprint.

Figure 4:
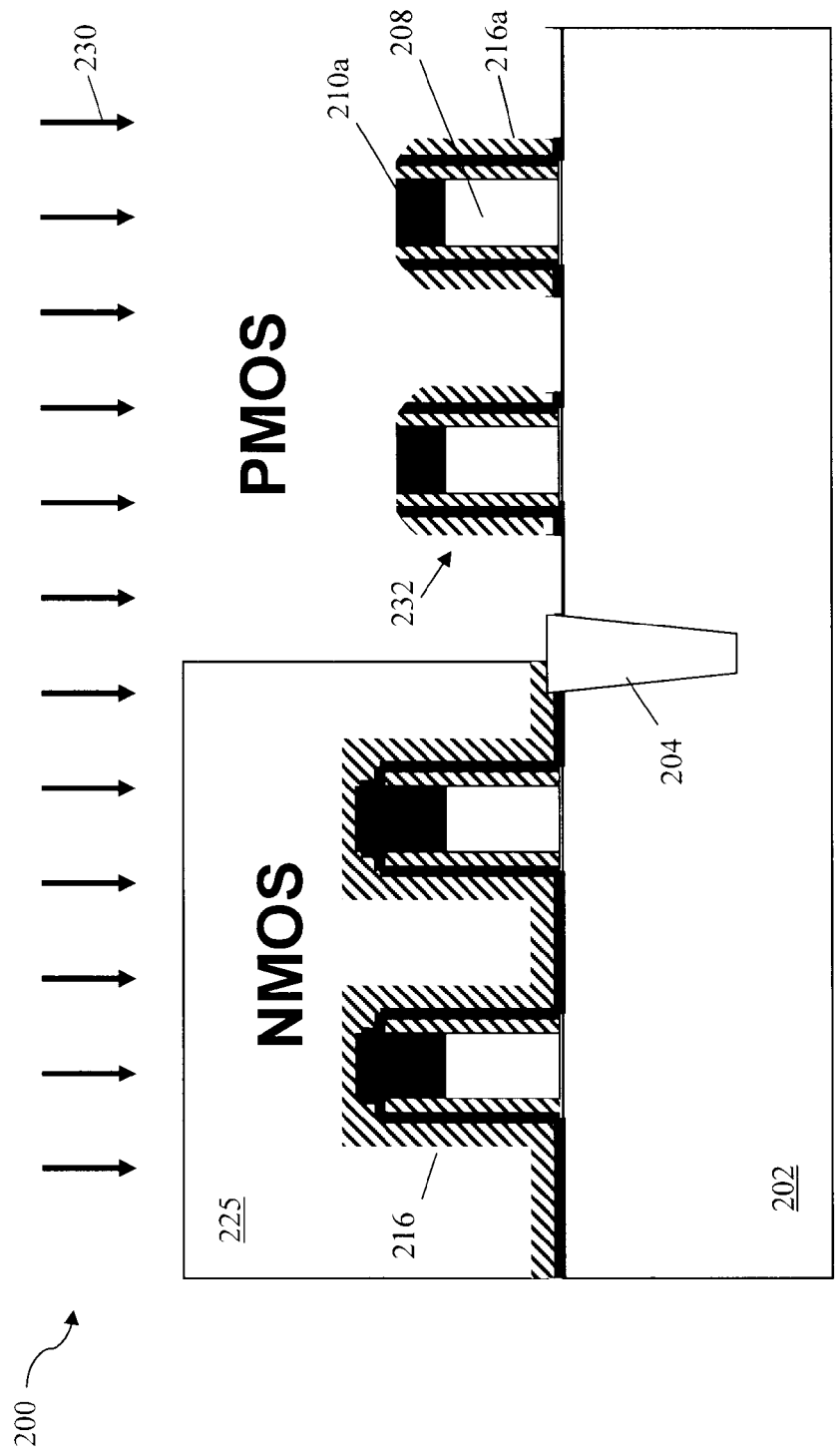

In FIG. 4, an etching process 230 is performed to remove portions of the cap layer 216 overlying the substrate 202 at either side of the gate structures of the PMOS devices. The patterned photoresist layer 225 protects the NMOS devices during the etching process 230. In the present embodiment, the etching process 230 includes a dry etching process. For example, the dry etching process utilizes a pressure ranging from about 5 to about 15 mTorr, a power ranging from about 300 to about 900 W, HBr having a flow rate ranging from about 100 to about 400 sccm, O2/He having a flow rate ranging from about 10 to about 40 sccm, and NF3 having a flow rate ranging from about 1 to about 20 sccm. The etching process 230 also removes the cap layer 216 overlying the hard mask layer 210. Further, the etching process 230 continues to break through the oxide layer 214 (if present) directly overlying the substrate 202 and removes a portion of the hard mask layer 210 on the gate electrode 208. Therefore, following the etching process 230, sidewall spacers 232 with an outer implanted cap layer 216a are formed on the sidewalls of the gate structures of the PMOS devices. Further, a portion of the hard mask layer 210a remains on the gate electrode 208. It is understood that the etching process 230 may be performed as one etching process or multiple etching processes.

Figure 5:
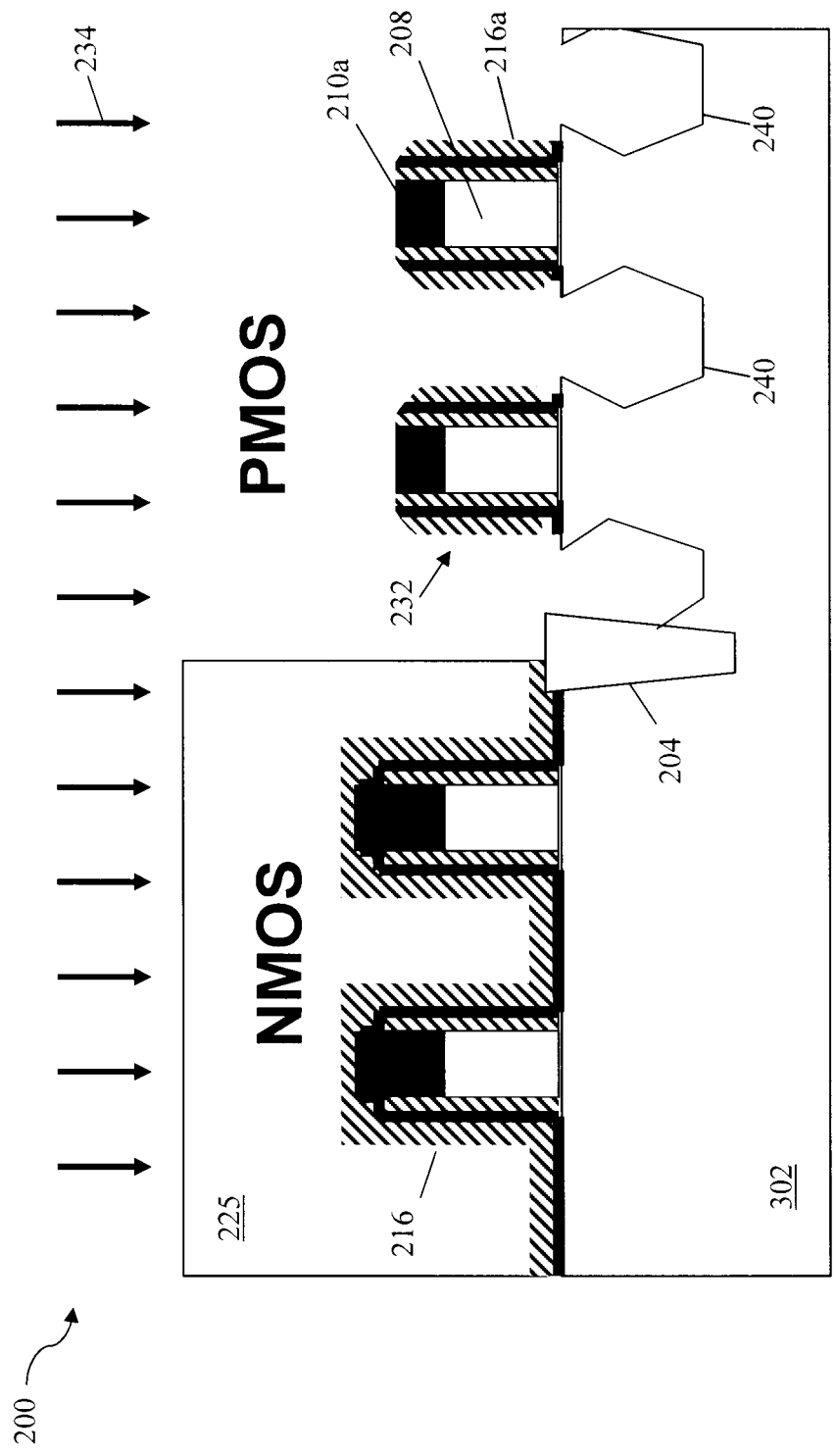

In FIG. 5, an etching process 234 is performed to etch recesses or openings 240 in the substrate 202. The etching process 230 includes a dry etching process, wet etching process, or combination dry and wet etching processes to remove portions of the silicon substrate 202 that are exposed. For example, the dry etching process utilizes a pressure ranging from about 5 to about 15 mTorr, a power ranging from about 300 to about 900 W, HBr having a flow rate ranging from about 100 to about 400 sccm, O2/He having a flow rate ranging from about 10 to about 40 sccm, Cl2 having a flow rate ranging from about 20 to about 60 sccm, and NF3 having a flow rate ranging from about 1 to about 20 sccm. It is noted that the hard mask layer 210a and spacers 232 protect the gate structures of the PMOS devices, and the patterned photoresist layer 225 protects the NMOS devices during the etching process. The recesses 240 may have a depth ranging from about 400 to about 500 angstrom (A).

Figure 6:
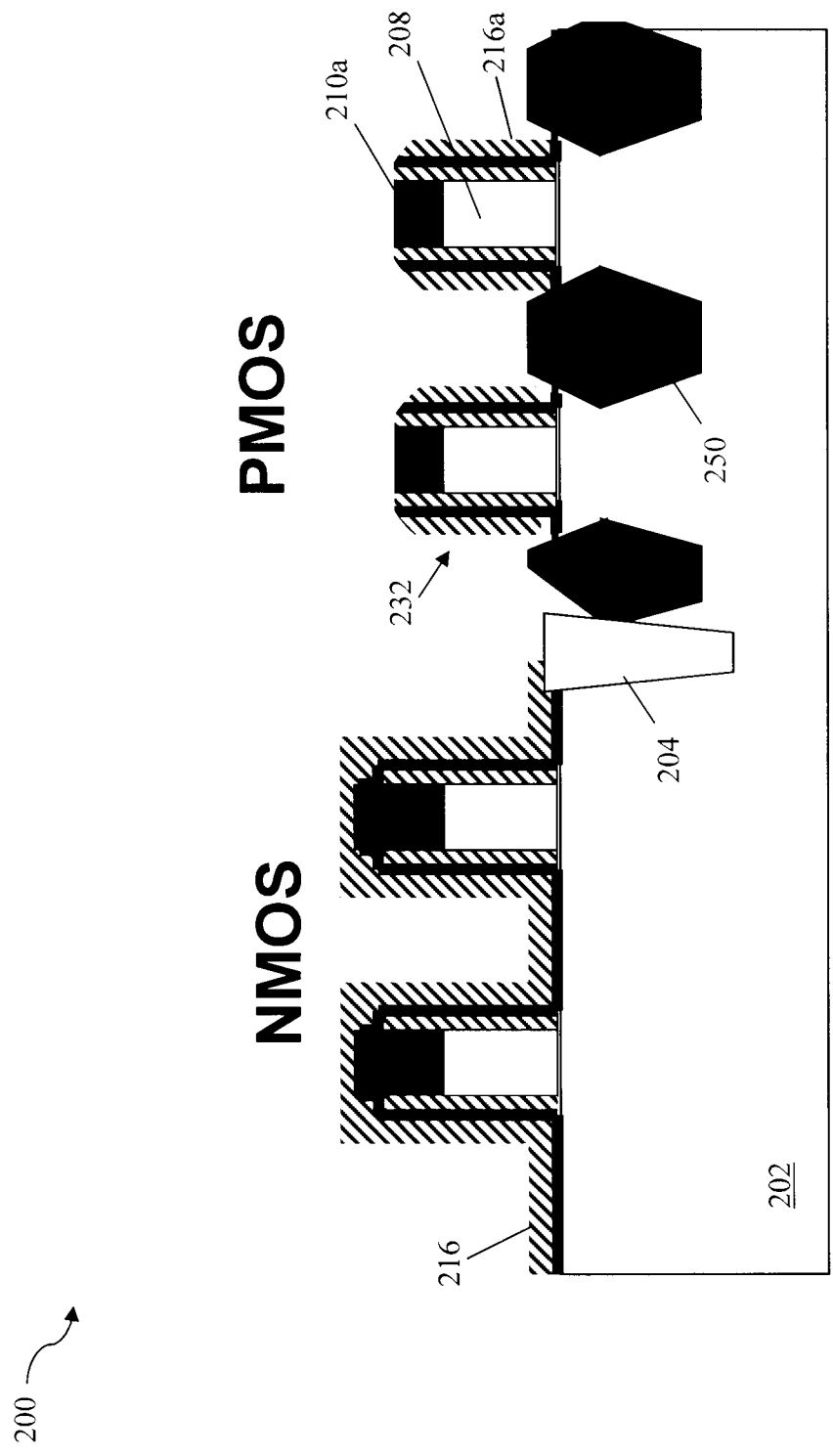

In FIG. 6, a semiconductor material is deposited in the recesses 240 to form strained structures of the semiconductor device 200. In an embodiment, an epitaxy or epitaxial (epi) process is performed to deposit a semiconductor material in the recesses 240. The semiconductor material is different from the substrate 202. Accordingly, the channel region of the PMOS device is strained or stressed to enable carrier mobility of the device and enhance device performance. The patterned photoresist 225 protecting the NMOS devices is removed prior to the epi process. In the present embodiment, silicon germanium (SiGe) is deposited by an epi process in the recesses 240 of the substrate 202 to form SiGe features 250 in a crystalline state on the silicon substrate. It has been observed that the implanted cap layer 216 overlying the NMOS devices and the implanted cap layer 216a on the sidewalls of the gate structures of the PMOS devices do not exhibit SiGe selectivity loss. That is, the SiGe selectivity to silicon nitride is improved by the implantation process 220 such that SiGe is deposited on the silicon substrate and not on the implanted silicon nitride. Accordingly, an etchant gas such as HCl does not have to be used with the epi process to maintain the selectivity between silicon nitride and silicon substrate. It has been observed that the SiGe growth rate is adversely impacted when using an etchant gas, and a facet profile of the SiGe feature is constrained. Thus, since the embodiments disclosed herein do not require utilizing an etchant gas, through-put is increased and a larger process window is achieved.

It is noted that the SiGe features 250 do not accumulate on the hard mask 210a, the cap layer 216 overlying the NMOS devices, the cap layer 216a of the spacer 232, and the STI 204. Additionally, the SiGe features 250 may be deposited such that they are raised about 125 angstrom (A) above the surface of the substrate 202. In furtherance of the present embodiment, the SiGe features 250 may be in-situ doped with p-type dopants, such as B or In, to form source and drain regions of the PMOS devices.

The semiconductor device 200 continues with processing to complete fabrication as discussed briefly below. For example, an etching process is performed to remove portions of the cap layer 216 overlying the NMOS region thereby forming sidewall spacers on the gate structures of the NMOS devices. Further, source and drain regions for the NMOS device may be formed by ion implantation of n-type dopants such as P or As. In another embodiment, silicon carbide (SiC) may be deposited by an epi process in the silicon substrate to form the source/drain regions of the NMOS devices in a similar manner as described above. Additionally, silicide features are formed on the raised source and drain regions to reduce the contact resistance. The silicide can be formed on the source and drain regions by a process including depositing a metal layer, annealing the metal layer such that the metal layer is able to react with silicon to form silicide, and then removing the non-reacted metal layer.

An inter-level dielectric (ILD) layer is formed on the substrate and a chemical mechanical polishing (CMP) process is further applied to the substrate to planarize the substrate. Further, an contact etch stop layer (CESL) is formed on top of the gate structures before forming the ILD layer. In an embodiment, the gate electrode 208 remains poly in the final device. In another embodiment, the poly is removed and replaced with a metal in a gate last or gate replacement process. In a gate last process, the CMP process on the ILD layer is continued to expose the poly of the gate structures, and an etching process is performed to remove the poly thereby forming trenches. The trenches are filled with a proper work function metal (e.g., p-type work function metal and n-type work function metal) for the PMOS devices and the NMOS devices.

A multilayer interconnection (MLI) including metal layers and inter-metal dielectric (IMD) is formed on the substrate to electrically connect various device features to form a integrated circuit. The multilayer interconnection includes vertical interconnects, such as conventional vias or contacts, and horizontal interconnects, such as metal lines. The various interconnection features may implement various conductive materials including copper, tungsten and silicide. In one example, a damascene process is used to form copper multi-layer interconnection structure.

The semiconductor device 200 serves only as one example. The semiconductor device 200 may be used in various applications such as digital circuit, imaging sensor devices, a hetero-semiconductor device, dynamic random access memory (DRAM) cell, a single electron transistor (SET), and/or other microelectronic devices (collectively referred to herein as microelectronic devices). Of course, aspects of the present disclosure are also applicable and/or readily adaptable to other type of transistor, including single-gate transistors, double-gate transistors, and other multiple-gate transistors, and may be employed in many different applications, including sensor cells, memory cells, logic cells, and others.

The foregoing has outlined features of several embodiments. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A method comprising:
   forming a first gate structure of a first transistor of a first type of conductivity over a substrate;
   forming a second gate structure of a second transistor of a second type of conductivity over the substrate and adjacent the first gate structure;
   forming a material layer over the first gate structure and the second gate structure;
   implanting a dopant into the material layer over the first gate structure and the second gate structure;

forming first sidewall spacers on the first gate structure by removing portions of the material layer implanted with the dopant over the first gate structure, wherein the first sidewall portions includes remaining portions of the material layer implanted with the dopant over the first gate structure; and forming second sidewall spacers on the second gate structure by removing portions of the material implanted with the dopant over the second gate structure, wherein the second sidewall portions include remaining portions of the material layer implanted with the dopant over the second gate structure, and wherein the substrate adjacent the first sidewall spacers is free of the dopant implanted into the material layer and wherein the semiconductor substrate adjacent the second sidewall spacers is free of the dopant implanted into the material layer.

2. The method of claim 1, further comprising forming recesses in the substrate at either side of the first gate structure.

3. The method of claim 2, further comprising forming a semiconductor material in the recesses by an epitaxy process that does not include providing an etchant gas.

4. The method of claim 3, wherein forming the semiconductor material in the recesses by the epitaxy process includes forming the semiconductor material above a top surface of the substrate.

5. The method of claim 3, wherein the substrate is formed of another semiconductor material such that the semiconductor material formed in the recesses is different than the another semiconductor material.

6. The method of claim 1, wherein the dopant is one of Ge, C, P, F, and B.

7. The method of claim 1, further comprising forming an oxide layer over the first gate structure and the second gate structure, and
wherein the material layer is formed over the oxide layer and includes silicon nitride.

8. A method comprising:
forming a gate structure over a substrate;
forming a shallow trench isolation structure in the substrate;
forming a material layer over the substrate, including the shallow trench isolation structure, and the gate structure;
implanting a dopant into the material layer over the substrate, including the shallow trench isolation structure, and the gate structure;
removing portions of the material layer implanted with the dopant overlying the substrate at either side of the gate structure and overlying the shallow trench isolation structure to expose a portion of the shallow trench isolation structure;
forming recesses in the substrate at either side of the gate structure after removing portions of the material layer implanted with the dopant; and
depositing a semiconductor material in the recesses by an epitaxy process.

9. The method of claim 8, wherein depositing the semiconductor material in the recesses by the epitaxy process occurs without providing an etchant gas.

10. The method of claim 8, wherein the material layer includes silicon nitride.

11. The method of claim 8, wherein implanting the dopant into the material layer over the substrate and the gate structure occurs without performing an annealing process.

12. The method of claim 8, wherein removing portions of the material layer implanted with the dopant overlying the substrate at either side of the gate structure includes removing portions of the material layer implanted with the dopant overlying the gate structure to expose a top surface of the gate structure.

13. The method of claim 12, wherein the gate structure includes a gate dielectric, a gate electrode, and a capping layer, and
wherein the exposed top surface of the gate structure includes a portion of the capping layer.

14. The method of claim 8, wherein the dopant is one of Ge, C, P, F, and B.

15. The method of claim 8, wherein forming the gate structure over the substrate includes forming another gate structure over the substrate, wherein the gate structure is part of a first transistor having a first type of conductivity and the another gate structure is part of a second transistor having a second type of conductivity that is opposite the first type of conductivity,
wherein forming the material layer over the substrate, including the shallow trench isolation structure, and the gate structure includes forming the material layer over the another gate structure,
wherein implanting the dopant into the material layer over the substrate and the gate structure includes implanting the dopant into the material layer over the another gate structure,
wherein after removing portions of the material layer implanted with the dopant overlying the substrate at either side of the gate structure a first remaining portion of the material layer forms a first sidewall spacer along the gate structure,
wherein removing portions of the material layer implanted with the dopant overlying the substrate at either side of the gate structure includes removing portions of the material layer implanted with the dopant overlying the substrate at either side of the another gate structure,
wherein after removing portions of the material layer implanted with the dopant overlying the substrate at either side of the another gate structure a second remaining portion of the material layer forms a second sidewall spacer along the another gate structure, and
wherein the substrate adjacent the first sidewall spacer is free of the dopant implanted into the material layer and wherein the substrate adjacent the second sidewall spacer is free of the dopant implanted into the material layer.

16. A device comprising:
a semiconductor substrate;
a first transistor of a first type of conductivity that includes a first gate structure disposed on the semiconductor substrate, the first gate structure including first sidewall spacers that are implanted with a dopant, wherein the semiconductor substrate adjacent the first sidewall spacers is free of the dopant implanted into the first sidewall spacers;
a second transistor of a second type of conductivity that includes a second gate structure disposed on the semiconductor substrate, the second gate structure including second sidewall spacers that are implanted with the dopant, wherein the semiconductor substrate adjacent the second sidewall spacers is free of the dopant implanted into the second sidewall spacers; and
a shallow trench isolation structure disposed in the semiconductor substrate between the first and second transistors, wherein at least a portion of the shallow trench isolation structure is not covered by the first sidewall spacers that are implanted with the dopant and wherein at least the portion of the shallow trench isolation structure is not covered by the second sidewall spacers that are implanted with the dopant.

17. The device of claim 16, wherein the second transistor further includes source and drain regions disposed in the semiconductor substrate at either side of the second gate structure, the source and drain regions formed of a semiconductor material different from the semiconductor substrate.

18. The device of claim 17, wherein the semiconductor material includes silicon germanium.

19. The device of claim 16, wherein the second gate structure includes a polysilicon gate electrode.

20. The device of claim 16, wherein the dopant is one of Ge, C, P, F, and B.

* * * * *